United States Patent
Inoue et al.

(10) Patent No.: US 7,075,214 B2
(45) Date of Patent: Jul. 11, 2006

(54) PIEZOELECTRIC RESONATOR AND ELECTRONIC COMPONENT PROVIDED THEREWITH

(75) Inventors: Kenji Inoue, Tokyo (JP); Hisatoshi Saito, Tokyo (JP); Takao Noguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/061,883

(22) Filed: Feb. 22, 2005

(65) Prior Publication Data

US 2005/0200432 A1 Sep. 15, 2005

(30) Foreign Application Priority Data

Mar. 10, 2004 (JP) .......................... P2004-067654

(51) Int. Cl.
*H01L 41/08* (2006.01)
*H03H 9/54* (2006.01)

(52) U.S. Cl. ...................... 310/328; 333/189
(58) Field of Classification Search ............... 310/328; 333/187
See application file for complete search history.

(56) References Cited

U.S. PATENT DOCUMENTS

| 6,841,922 B1* | 1/2005 | Aigner et al. | 310/335 |
| 6,933,807 B1* | 8/2005 | Marksteiner et al. | 333/187 |
| 2001/0017504 A1* | 8/2001 | Aigner et al. | 310/330 |
| 2002/0089393 A1* | 7/2002 | Tikka et al. | 333/133 |
| 2002/0109564 A1* | 8/2002 | Tsai et al. | 333/187 |
| 2004/0212458 A1* | 10/2004 | Lee | 333/191 |
| 2004/0227591 A1* | 11/2004 | Aigner et al. | 333/191 |
| 2005/0134406 A1* | 6/2005 | Inoue | 333/187 |

FOREIGN PATENT DOCUMENTS

| JP | A 05-167388 | 7/1993 |
| JP | A 2003-022074 | 1/2003 |

* cited by examiner

Primary Examiner—Darren Schuberg
Assistant Examiner—J. Aguirrechea
(74) Attorney, Agent, or Firm—Oliff & Berridge, PLC

(57) ABSTRACT

A piezoelectric resonator according to an embodiment of the present invention is a piezoelectric resonator for obtaining a signal of a predetermined resonance frequency from a bulk acoustic wave propagating inside a piezoelectric film. This piezoelectric resonator has a plurality of transducers stacked in a predetermined direction, and a propagation area of the bulk acoustic wave varies in a propagation direction of the bulk acoustic wave.

3 Claims, 12 Drawing Sheets

PIEZOELECTRIC RESONATOR AND ELECTRONIC COMPONENT PROVIDED THEREWITH

BACKGROUND OF THE INVENTION

1. Field of the Invention

The present invention relates to a piezoelectric resonator and an electronic component provided therewith and, more particularly, to a technology effective to achievement of a wider bandwidth of a passing property in a piezoelectric resonator having stacked transducers.

2. Related Background of the Invention

In recent years there are increasing demands for compact, low-loss, and wide pass bandwidth filters in order to keep up with fast large-volume communication. Filters meeting such demands and frequently used are Surface Acoustic Wave (SAW) filters with compact and low-loss characteristics, and antenna duplexers using the SAW filters. However, operating frequencies are becoming higher from demands for faster larger-volume communication.

A SAW filter is a filter for exciting and receiving a surface acoustic wave with use of interdigital electrodes in which electrode fingers in the width of about a quarter of the wavelength λ of the propagating surface acoustic wave are alternately placed on a piezoelectric substrate. The line width of the electrode fingers of the SAW filter used in 2-GHz band systems is approximately 0.4 μm. For supporting achievement of higher frequencies of this SAW filter, it is necessary to precisely process the electrode fingers of not more than 0.4 μm. Therefore, there is a high possibility of considerable degradation of productivity.

A SAW filter is disclosed, for example, in Japanese Patent Application Laid-Open No. 5-167388.

Under such circumstances, attention is drawn to transducers with a piezoelectric thin film being a kind of devices using the Bulk Acoustic Wave (BAW devices), for example, as described in Japanese Patent Application Laid-Open No. 2003-22074. The operating frequency of the BAW devices is determined by the thickness of the piezoelectric film interposed between input and output electrodes.

In passing, the conventional transducer filters using ceramics or quartz have not been used for high-frequency usage, because it is difficult to precisely process the thin piezoelectric film. On the other hand, in the case of thin-film transducer filters, the piezoelectric film can be formed by means of a film-forming system of sputtering or the like; therefore, it is easy to obtain the piezoelectric film in a desired thickness. The thin-film transducer filters thus have advantage in achievement of higher frequencies. The electrodes used in the thin-film transducer filters are flat-plate electrodes. Since the thin-film transducer filters do not have to use the thin electrodes as used in the SAW filters, high-power signals can be handled therein accordingly.

A piezoelectric resonator comprised of a conventional stack type transducer is shown in FIG. 9.

The conventional piezoelectric resonator 40 shown in FIG. 9 is composed of a substrate 11, for example, of silicon, an acoustic multilayer reflecting film 12 disposed on the substrate 11, and a transducer 22 disposed on the acoustic multilayer reflecting film 12. The acoustic multilayer reflecting film 12 has first reflecting films 12a and second reflecting films 12b alternately stacked. The first reflecting films 12a and the second reflecting films 12b have their respective acoustic impedances different from each other. The transducer 22 has a first electrode film 20a, a piezoelectric film 21, and a second electrode film 20b stacked in order. A plurality of such transducers 22 in the structure in which the piezoelectric film 21 is sandwiched between the upper and lower electrode films 20a, 20b, are two-dimensionally arranged and the transducers 22 are electrically connected in a ladder configuration, thereby constituting a filter or a duplexer.

SUMMARY OF THE INVENTION

Since the filters of this structure normally use about five to seven transducers, it was, however, impossible to realize the chip area of not more than (the number of transducers× the area of transducers).

There are also known filters such as a stacked transducer filter in which transducers are three-dimensionally arranged by stacking two or more piezoelectric films (SCF: Stacked Crystals Filter) or a multi-mode transducer filter in which a propagation layer is disposed between transducers (CRF: Coupled Resonator Filter). However, since SCF is a narrowband filter, it is unsuitable for broadband application. CRF uses multiple modes and is thus advantageous in achievement of wider bandwidths, but it could hardly be said that CRF is adequate to achievement of much wider bandwidths expected from future development toward faster larger-volume communication.

An object of the present invention is therefore to provide a technology capable of achieving a wider bandwidth of the passing property in a piezoelectric resonator in the structure in which a plurality of transducers are stacked.

A first piezoelectric resonator according to the present invention is a piezoelectric resonator that obtains a signal of a predetermined resonance frequency from a bulk acoustic wave propagating inside a piezoelectric film. The first piezoelectric resonator comprises a plurality of transducers. Each of the transducers has a first electrode film, a second electrode film, and a piezoelectric film disposed between the first electrode film and the second electrode film. The plurality of transducers are stacked in a predetermined direction. In this piezoelectric resonator, a propagation area of the bulk acoustic wave varies in a direction of propagation of the bulk acoustic wave.

A second piezoelectric resonator according to the present invention is the first piezoelectric resonator comprising a portion whose propagation area of the bulk acoustic wave is not more than 90% of the propagation area of the bulk acoustic wave in the other portion.

A third piezoelectric resonator according to the present invention is the first or second piezoelectric resonator in which an area of at least one transducer out of the plurality of transducers is different from an area of the other transducers.

A fourth piezoelectric resonator according to the present invention is the third piezoelectric resonator further comprising an acoustic multilayer reflecting film for reflecting the bulk acoustic wave, the acoustic multilayer reflecting film having a configuration wherein first reflecting films with a predetermined acoustic impedance and second reflecting films with an acoustic impedance different from that of the first reflecting films are alternately stacked in the predetermined direction. In this fourth piezoelectric resonator, the plurality of transducers are formed on the acoustic multilayer reflecting film, and an area of a transducer in contact with the acoustic multilayer reflecting film out of the plurality of transducers is smaller than the area of the other transducers.

A fifth piezoelectric resonator according to the present invention is the first or second piezoelectric resonator further comprising a propagation layer disposed between two transducers out of the plurality of transducers. In this fifth piezoelectric resonator, an area of the propagation layer is different from an area of at least one transducer out of the plurality of transducers.

A sixth piezoelectric resonator according to the present invention is the fifth piezoelectric resonator in which the area of the propagation layer is smaller than an area of at least one transducer out of the plurality of transducers.

A seventh piezoelectric resonator according to the present invention is the sixth piezoelectric resonator further comprising an acoustic multilayer reflecting film for reflecting the bulk acoustic wave, the acoustic multilayer reflecting film having a configuration wherein first reflecting films with a predetermined acoustic impedance and second reflecting films with an acoustic impedance different from that of the first reflecting films are alternately stacked in the predetermined direction. In this seventh piezoelectric resonator, the plurality of transducers are formed on the acoustic multilayer reflecting film, and the area of the propagation layer is equal to the area of the transducers other than the transducer in contact with the acoustic multilayer reflecting film out of the plurality of transducers.

An eighth piezoelectric resonator of the present invention is one of the first to seventh piezoelectric resonators of an SMR type or a diaphragm type.

An electronic component of the present invention comprises one of the first to eighth piezoelectric resonators described above.

DESCRIPTION OF THE PREFERRED EMBODIMENTS

The best mode for carrying out the present invention will be further specifically described below with reference to the drawings. The same members will be denoted by the same reference symbols throughout the accompanying drawings, without redundant description. It is noted that the description herein concerns the best mode of carrying out the present invention and the present invention is by no means intended to be limited to the mode.

First Embodiment

Figure 1:
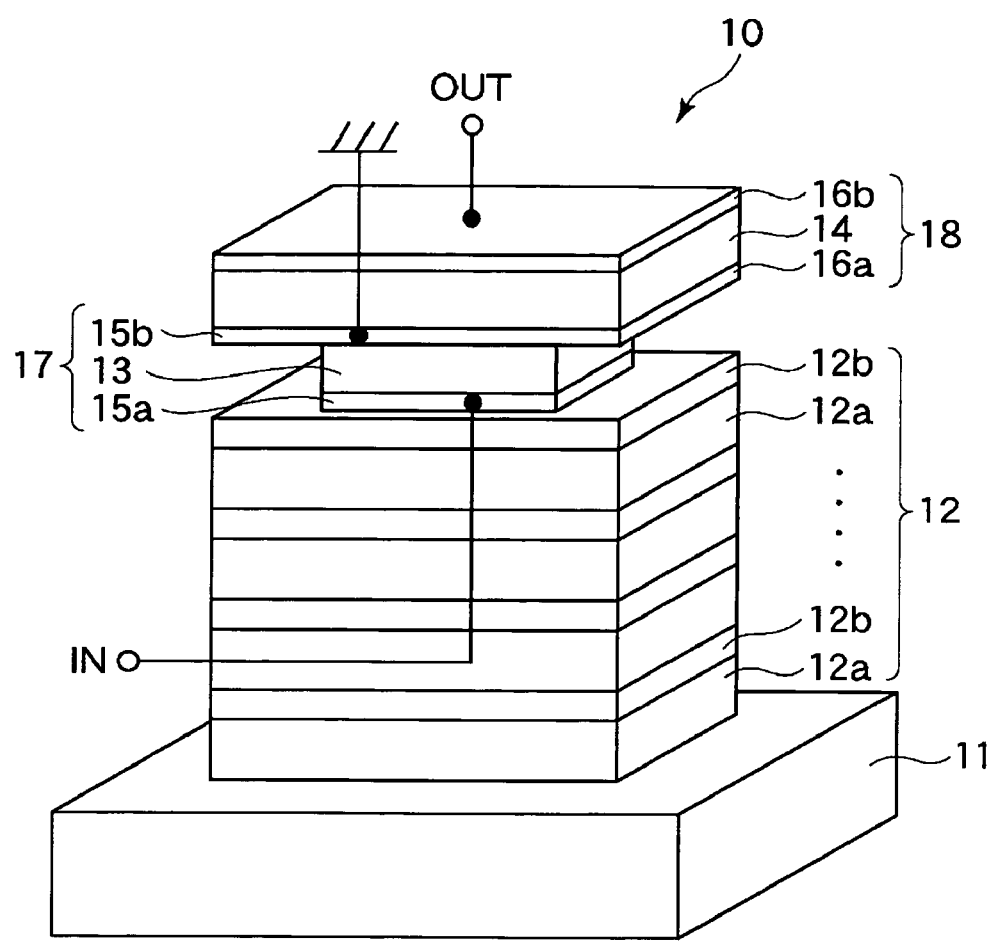
FIG. 1 is a perspective view showing a piezoelectric resonator according to the first embodiment of the present invention.
Figure 2:
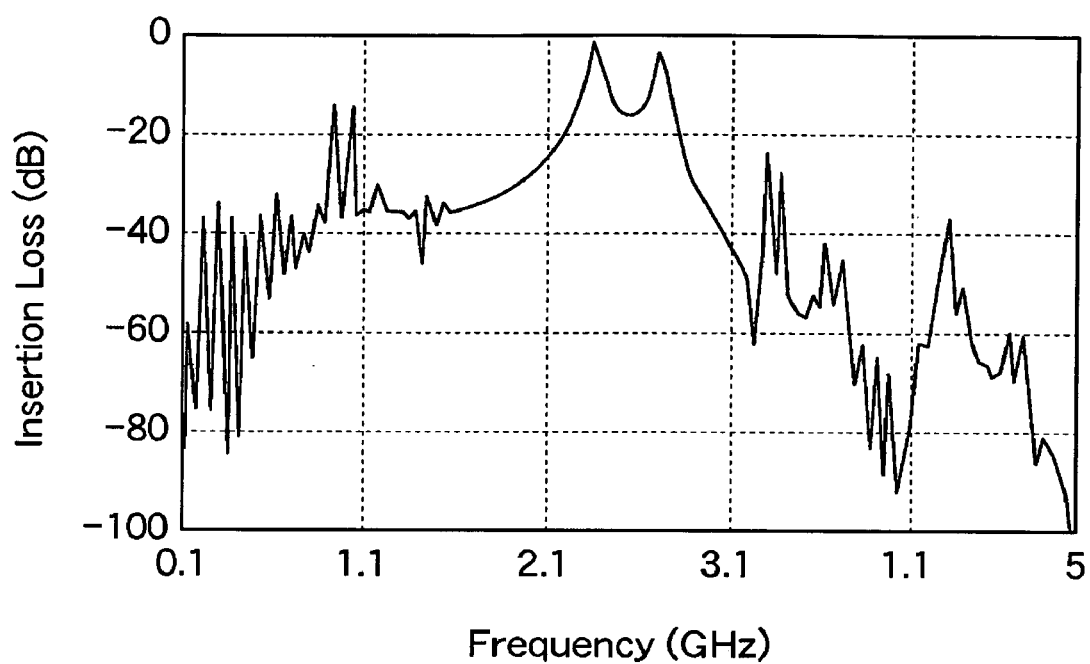
FIG. 2 is a graph showing a frequency characteristic of the piezoelectric resonator shown in FIG. 1.
Figure 3:
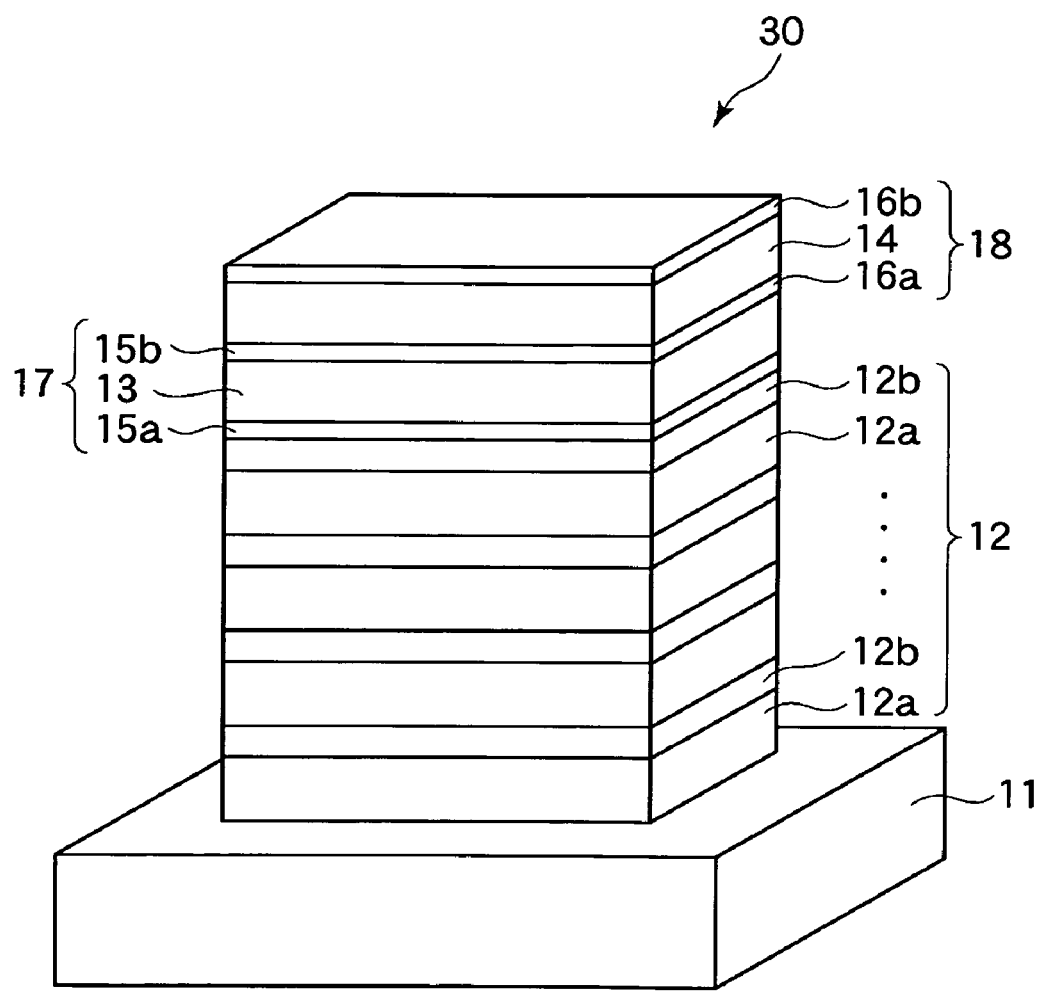
FIG. 3 is a perspective view showing a piezoelectric resonator as a comparative example.
Figure 4:
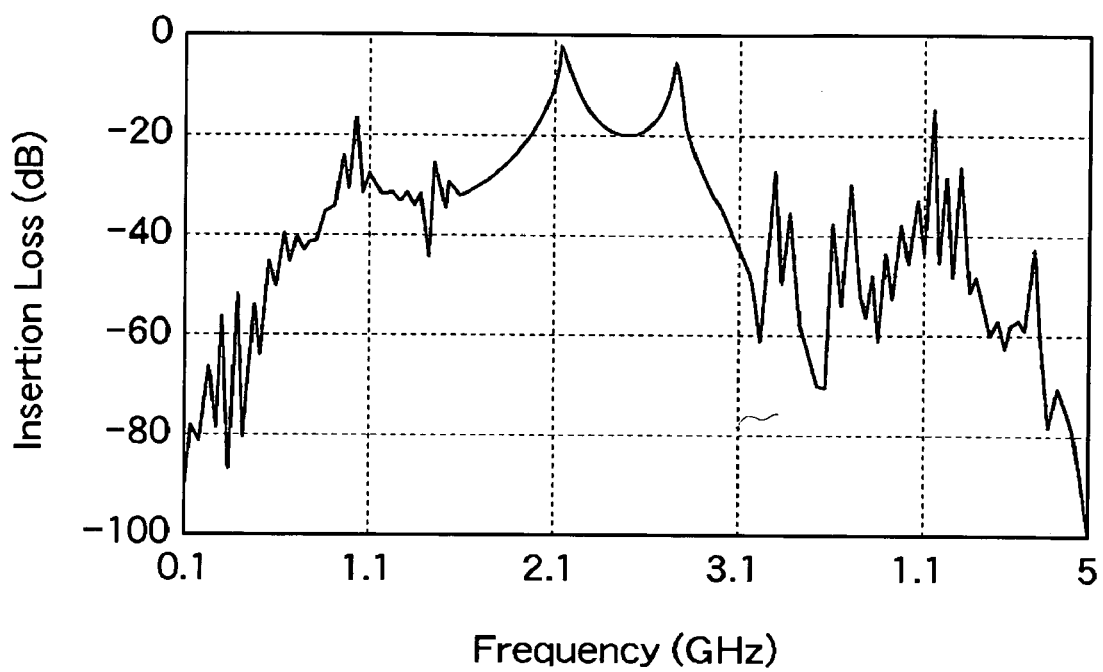
FIG. 4 is a graph showing a frequency characteristic of the piezoelectric resonator shown in FIG. 3.

FIG. 1 is a perspective view showing a piezoelectric resonator according to the first embodiment of the present invention, FIG. 2 a graph showing a frequency characteristic of the piezoelectric resonator shown in FIG. 1, FIG. 3 a perspective view showing a piezoelectric resonator as a comparative example, and FIG. 4 a graph showing a frequency characteristic of the piezoelectric resonator shown in FIG. 3.

The piezoelectric resonator 10 shown in FIG. 1 is called an SMR (Solidly Mounted Resonator) type piezoelectric resonator. The piezoelectric resonator 10 has a substrate 11, an acoustic multilayer reflecting film 12 disposed on one surface of the substrate 11, a first transducer 17, and a second transducer 18.

The substrate 11 is made, for example, of silicon or glass. The acoustic multilayer reflecting film 12 is constructed in a structure in which thin films with a high acoustic impedance and thin films with a low acoustic impedance, e.g., AlN films (first reflecting films) 12a and $SiO_2$ films (second reflecting films) 12b, are alternately stacked in a predetermined direction. This predetermined direction is a direction intersecting with one surface of the substrate 11, and is the stack direction of the reflecting films in the acoustic multilayer reflecting film 12. This predetermined direction is also a direction in which the first transducer 17 and the second transducer 18 are stacked, and is a direction of propagation of the bulk acoustic wave.

In the piezoelectric resonator 10 shown in FIG. 1, an AlN film 12a is formed directly on the substrate 11, but in a piezoelectric resonator according to the present invention, an $SiO_2$ film 12b may be formed directly on the substrate 11.

In the piezoelectric resonator 10, two layers of piezoelectric film 13 and piezoelectric film 14 are located in order in the stack direction (i.e., in the aforementioned predetermined direction) on the acoustic multilayer reflecting film 12. A lower electrode (first electrode film) 15a and an upper electrode (second electrode film) 15b are separately formed on both sides of one piezoelectric film 13 located on the acoustic multilayer reflecting film 12 side. Namely, the piezoelectric film 13 is located between the lower electrode 15a and the upper electrode 15b.

Furthermore, a lower electrode (first electrode film) 16a and an upper electrode (second electrode film) 16b are separately formed on both sides of the other piezoelectric film 14. Namely, the piezoelectric film 14 is disposed between the lower electrode 16a and the upper electrode 16b. The lower electrode 16a is shared as the upper electrode (second electrode film) 15b of the piezoelectric film 13.

In the piezoelectric resonator 10, the first transducer 17 is composed of the piezoelectric film 13, and the lower electrode 15a and upper electrode 15b located on both sides of this piezoelectric film 13. The second transducer 18 is composed of the piezoelectric film 14, and the lower electrode 16a and upper electrode 16b located on both sides of this piezoelectric film 14. In the piezoelectric resonator 10 the first transducer 17 and the second transducer 18 of this structure are stacked in the aforementioned predetermined direction.

As shown in FIG. 1, the area of the first transducer 17 is smaller than the area of the second transducer 18. In the piezoelectric resonator 10 shown in FIG. 1, the area of the first transducer 17 in contact with the acoustic multilayer reflecting film 12 is smaller than that of the second transducer 18; however, to the contrary, the area of the first transducer 17 may be larger than that of the second transducer 18.

The electrodes 15a, 15b (16a), 16b are made, for example, of a material such as Al, Au, Pt, or Mo, and the piezoelectric films 13, 14, for example, of a material such as AlN or ZnO.

The acoustic multilayer reflecting film 12 is not always essential, and in a case without the acoustic multilayer reflecting film 12, the lower electrode 15a is formed directly on the substrate 11.

The number of transducers in the piezoelectric resonator of the present invention does not have to be limited to two. Namely, the point is that a plurality of transducers are stacked in the predetermined direction in the piezoelectric resonator of the present invention. Where three or more transducers are stacked, the transducers may have their respective areas different from each other, or the area of at least one transducer may be different from the area of the other transducers.

The shape of the transducers 17, 18 and a later-described propagation layer is rectangular, but in the piezoelectric resonator of the present invention the shape of the transducers and propagation layer may be any shape such as a square, a circle, or an ellipse.

Where λ stands for the wavelength of the acoustic wave propagating in film, the thicknesses of the AlN films 12a and SiO$_2$ films 12b are approximately equal to a quarter of the wavelength λ. Namely, the thicknesses of the AlN films 12a and SiO$_2$ films 12b are set to be a quarter of the wavelength λ of the acoustic wave propagating in each film, near the resonance frequency of the piezoelectric resonator 10.

In the present embodiment, the thickness of the AlN films 12a being the first reflecting films is 0.64 µm, and the thickness of the SiO$_2$ films 12b being the second reflecting films 1.2 µm. The two piezoelectric films 13, 14 are made of AlN, and the thickness thereof is 2.25 µm. The area of the first transducer 17 is 0.026 mm$^2$, and the area of the second transducer 18 0.1 mm$^2$. Namely, in the piezoelectric resonator 10 the area of the first transducer 17 is not more than 90% (26% in the present embodiment) of the area of the second transducer 18. As a consequence, the propagation area of the bulk acoustic wave in the first transducer 17 is not more than 90% of the propagation area of the bulk acoustic wave in the second transducer 18. It is, however, a matter of course that the present invention is not limited to these numerical values.

In the piezoelectric resonator 10 having the above-described configuration, the ground potential is applied to the electrode 15b (16a), and an input signal is applied to the lower electrode 15a of the first transducer 17. When a total of acoustic phase lengths determined by the frequency of the input signal and speeds of the bulk acoustic wave in the respective layers satisfies n×λ/2 (n=1, 2, 3 . . . ) (resonance frequencies), a standing wave is excited to generate a strong signal between the electrodes 16a, 16b of the second transducer. No standing wave is excited at the other frequencies, and little signal transmission occurs thereat. This obtains filter characteristics having predetermined frequency bands as passing bands.

In the piezoelectric resonator 10 of the present embodiment, as described above, the area of the first transducer 17 is smaller than that of the second transducer 18, and thus the propagation area of the bulk acoustic wave is not constant in the propagation direction of the bulk acoustic wave (i.e., in the stack direction). Namely, the propagation area of the bulk acoustic wave varies in the propagation direction of the bulk acoustic wave.

In the present specification, the propagation area of the bulk acoustic wave is a cross section of a region perpendicular to the propagation direction of the bulk acoustic wave, and is a concept indicating the cross section of the region where the bulk acoustic wave actually propagates.

The frequency characteristic of the piezoelectric resonator 10 shown in FIG. 1 is presented in FIG. 2. There appear two passing regions in the frequency characteristic shown in FIG. 2. These two passing regions are resonance peaks corresponding to the acoustic phase lengths of λ and (3/2)λ. The resonance peak of (1/2)λ is not observed, because it is off the reflection band of the (1/4)λ reflecting film. In the frequency characteristic shown in FIG. 2, the frequency difference between the peaks of the respective passing regions is approximately 360 MHz.

Now, a piezoelectric resonator 30 as a comparative example is shown in FIG. 3, and its frequency characteristic in FIG. 4.

In the piezoelectric resonator 30 shown in FIG. 3, different from the piezoelectric resonator 10 of the present embodiment shown in FIG. 1, the area of the first transducer 17 is equal to that of the second transducer 18. Therefore, the propagation area of the bulk acoustic wave does not vary or is constant in the propagation direction of the bulk acoustic wave. In the piezoelectric resonator 30 shown in FIG. 3, the thickness of the AlN films 12a being the first reflecting films is 0.64 µm, the thickness of the SiO$_2$ films 12b being the second reflecting films 1.2 µm, the thickness of the piezoelectric films 13, 14 of AlN 2.25 µm, and the areas of the first transducer 17 and the second transducer 18 both 0.026 mm$^2$.

According to the frequency characteristic of the piezoelectric resonator 30 of this structure, as shown in FIG. 4, the frequency difference between peaks of two passing regions is as large as about 600 MHz. Therefore, the piezoelectric resonator has a passing property of a very narrow band. It is difficult in this case to obtain a wide passing band by making use of the two peaks.

In contrast to it, in the piezoelectric resonator 10 of the present embodiment, as described above, the area of the first transducer 17 is smaller than that of the second transducer 18, and the propagation area of the bulk acoustic wave varies in the propagation direction of the bulk acoustic wave. Therefore, there occurs degeneration of modes in each of which a standing wave is excited. As a result, as shown in FIG. 2, the frequency difference between peaks is approximately 360 MHz, which is smaller than that in the comparative example shown in FIG. 4.

With this characteristic, a frequency property of a very wide band where the band including the frequency difference is defined as a passing band can be obtained by effecting predetermined impedance matching with an external circuit or the like.

Second Embodiment

Figure 5:
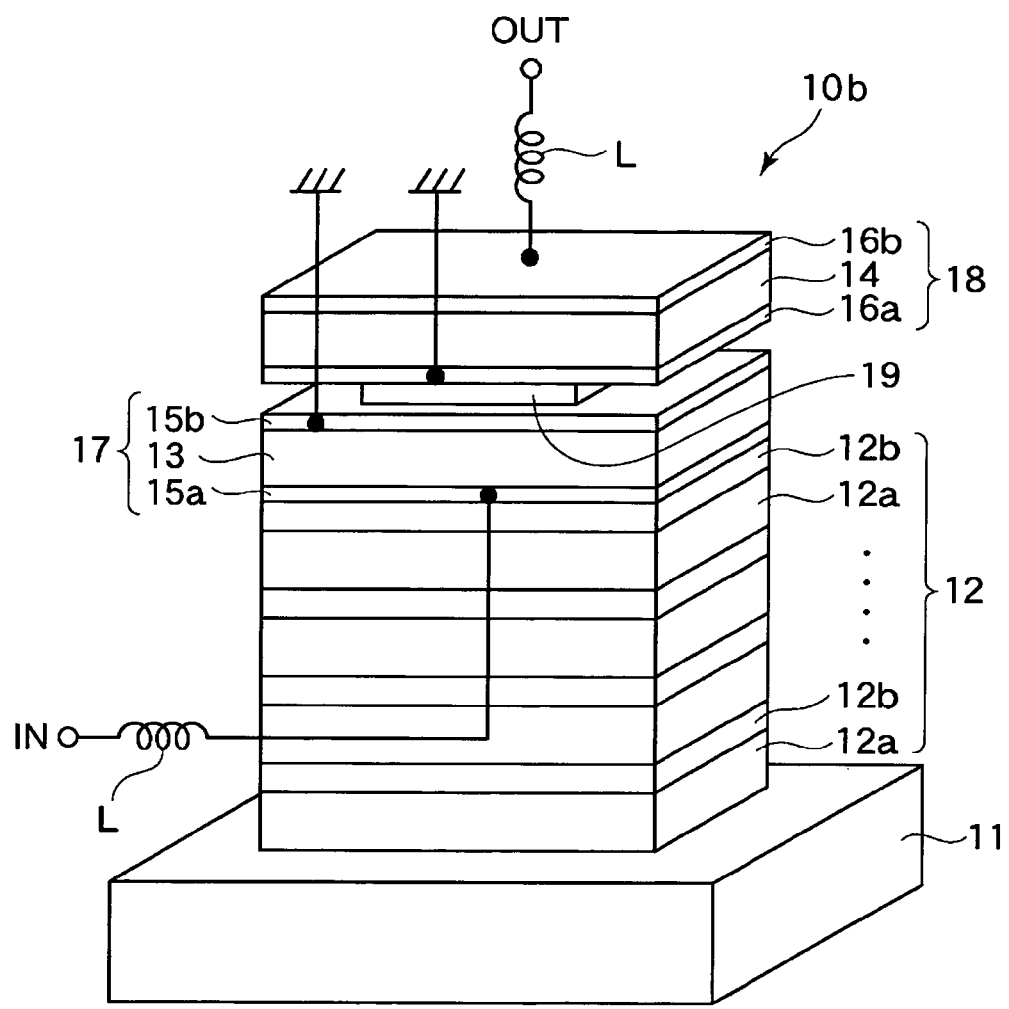
FIG. 5 is a perspective view showing a piezoelectric resonator according to the second embodiment of the present invention.
Figure 6:
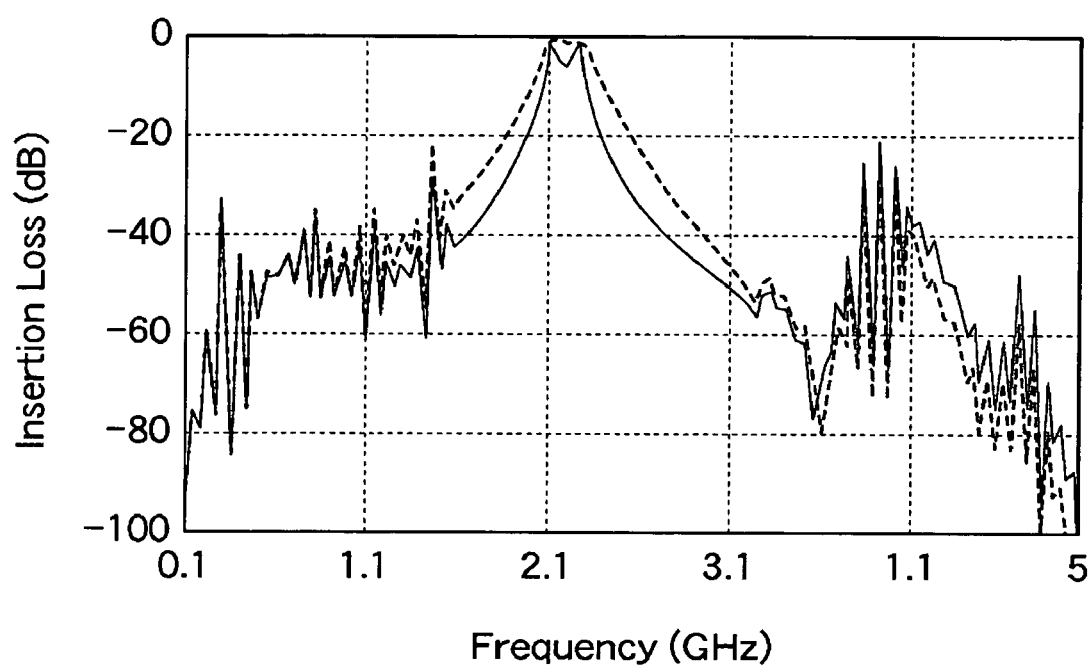
FIG. 6 is a graph showing a frequency characteristic of the piezoelectric resonator shown in FIG. 5.

FIG. 5 is a perspective view showing a piezoelectric resonator according to the second embodiment of the present invention, and FIG. 6 a graph showing a frequency characteristic of the piezoelectric resonator shown in FIG. 5.

In the piezoelectric resonator 10b shown in FIG. 5, a substrate 11, an acoustic multilayer reflecting film 12, a first transducer 17, a propagation layer 19, and a second transducer 18 are stacked in order in the predetermined direction.

In the piezoelectric resonator 10b, the propagation layer 19, for example, made of a dielectric material such as $SiO_2$ or insulating alumina is formed between the first transducer 17 and the second transducer 18.

In the piezoelectric resonator 10b the area of the first transducer 17 is equal to that of the second transducer 18, but the area of the propagation layer 19 is smaller than the area of the transducers 17, 18. In this configuration the propagation area of the bulk acoustic wave varies in the propagation direction of the bulk acoustic wave (i.e., the aforementioned predetermined direction).

The area of the propagation layer 19 may be different from the area of all the transducers, but may be different from the area of at least one transducer. Namely, the area of the propagation layer 19 may be equal to the area of one or more transducers.

In the piezoelectric resonator 10b the area of the propagation layer 19 is smaller than the area of the transducers 17, 18, but conversely, the area of the propagation layer 19 may be larger than the area of the transducers 17, 18. Furthermore, the means for achieving the different area of the propagation layer 19 does not always have to be one of adopting the contour of the propagation layer 19 different from that of the transducers 17, 18 as in the present embodiment, but may be a method of making the contour of the propagation layer 19 equal to that of the transducers 17, 18 and properly thinning the inside of the propagation layer. Specifically, the shape of the periphery of the propagation layer 19 is the same as the shape of the transducers 17, 18 and the propagation layer 19 is perforated.

In the present embodiment, the thickness of the AlN films 12a being the first reflecting films is 0.64 μm, and the thickness of the $SiO_2$ films 12b being the second reflecting films 1.2 μm. The two piezoelectric films 13, 14 are made of AlN and the thickness thereof is 2.25 μm. The area of the first transducer 17 and the second transducer 18 is 0.1 $mm^2$. The thickness of the propagation layer 19 is 0.55 μm, and the area of the propagation layer 19 0.085 $mm^2$. Namely, in the piezoelectric resonator 10b the area of the propagation layer 19 is not more than 90% (85% in the present embodiment) of the area of the first transducer 17 and the second transducer 18. In this configuration, the propagation area of the bulk acoustic wave in the propagation layer 19 is not more than 90% of the propagation area of the bulk acoustic wave in the first transducer 17 and the second transducer 18. It is, however, a matter of course that the present invention is not limited to these numerical values.

The frequency characteristic of the piezoelectric resonator 10b shown in FIG. 5 is presented in FIG. 6.

In the piezoelectric resonator 10b of the present embodiment, the area of the propagation layer 19 is different from that of the transducers 17, 18, whereby the propagation area of the bulk acoustic wave varies in the propagation direction of the bulk acoustic wave. Therefore, there occurs degeneration of modes in each of which a standing wave is excited. As a result, as indicated by a solid line in FIG. 6, the frequency difference between two peaks is approximately 160 MHz, which is smaller than that in the piezoelectric resonator 10 of the first embodiment.

This makes it feasible to obtain a frequency property of a very wide band in which the band including this frequency difference is defined as a passing band, by effecting predetermined impedance matching with an external circuit or the like.

In FIG. 6 a dotted line indicates a frequency characteristic where inductance elements L of 5 nH are connected as a matching circuit in series to the input and output terminals. It is seen from the illustration that a passing characteristic of the broad band of about 200 MHz is obtained in a 2 dB bandwidth.

Third Embodiment

Figure 7:
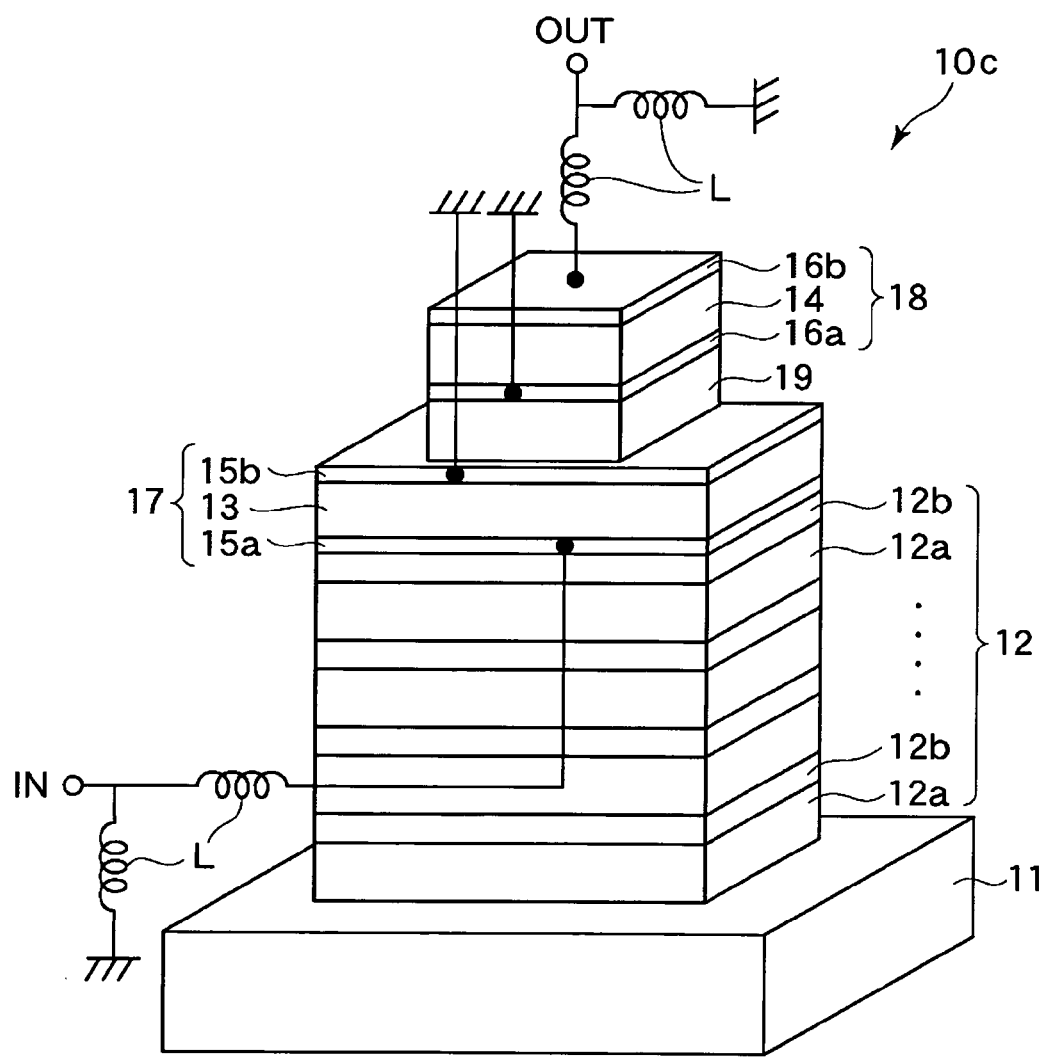
FIG. 7 is a perspective view showing a piezoelectric resonator according to the third embodiment of the present invention.
Figure 8:
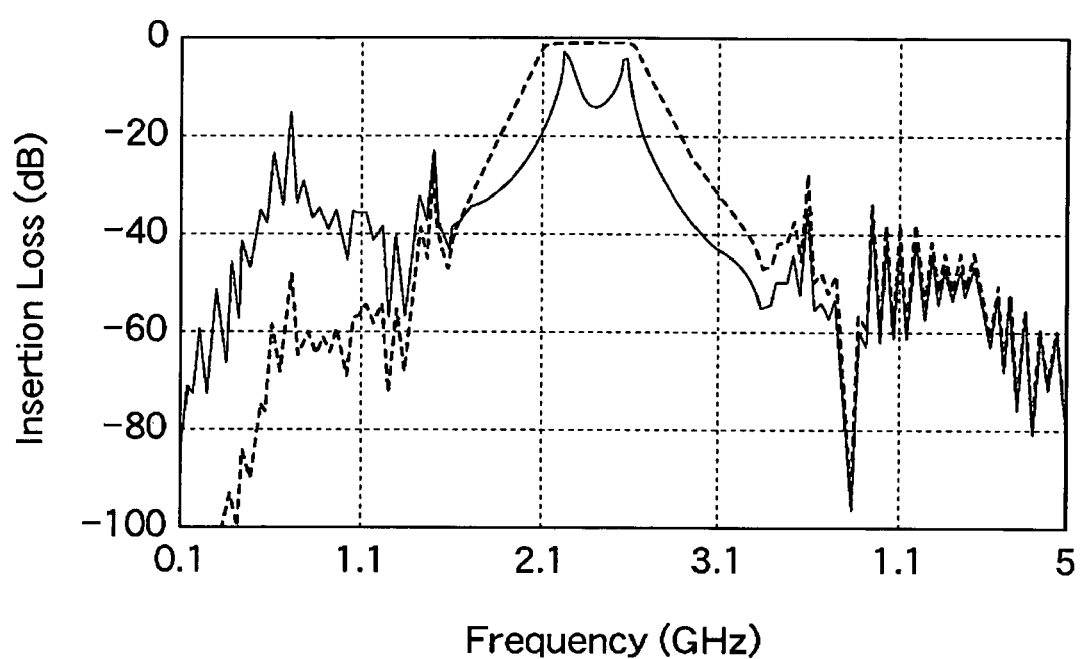
FIG. 8 is a graph showing a frequency characteristic of the piezoelectric resonator shown in FIG. 7.
Figure 9:
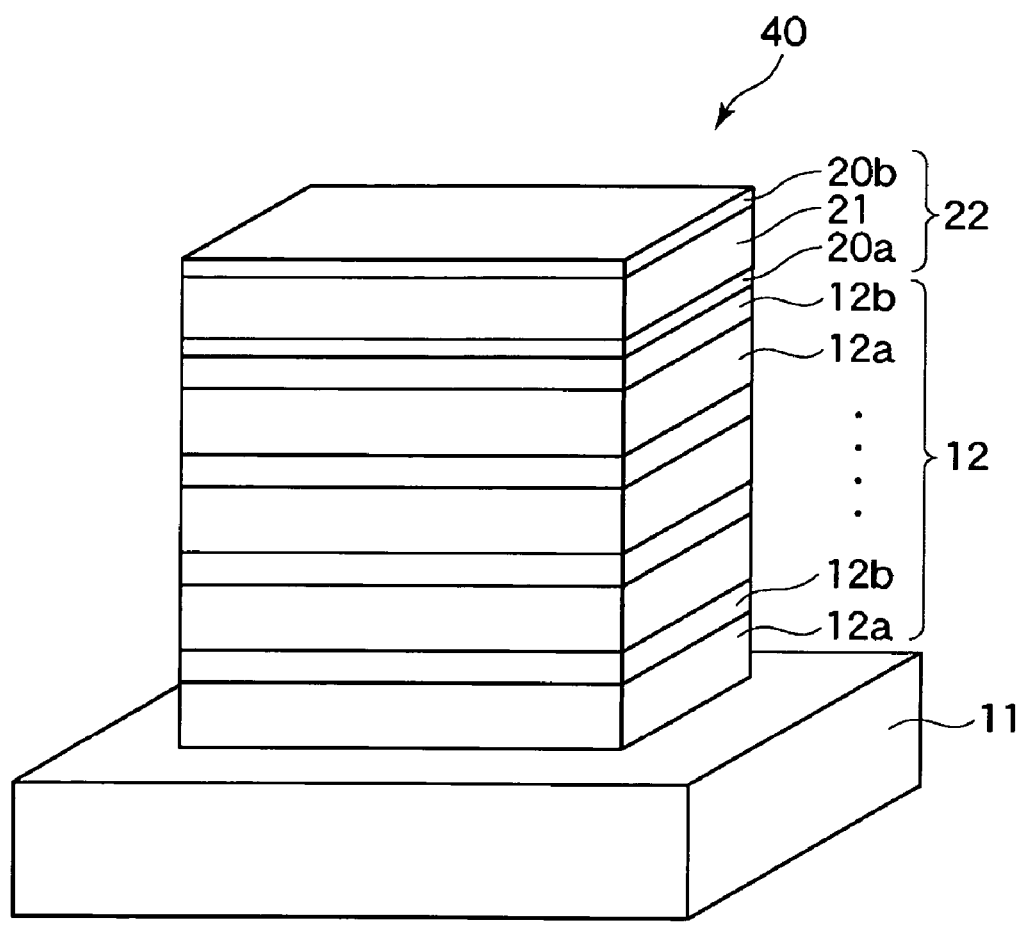
FIG. 9 is a perspective view showing a conventional piezoelectric resonator.

FIG. 7 is a perspective view showing a piezoelectric resonator according to the third embodiment of the present invention, and FIG. 8 a graph showing a frequency characteristic of the piezoelectric resonator shown in FIG. 7.

In the piezoelectric resonator shown in FIG. 7, a substrate 11, an acoustic multilayer reflecting film 12, a first transducer 17, a propagation layer 19, and a second transducer 18 are stacked in order in the aforementioned predetermined direction.

In the piezoelectric resonator 10c, the area of the propagation layer 19 formed between the first transducer 17 and the second transducer 18 is smaller than that of the first transducer 17 in contact with the acoustic multilayer reflecting film 12, and equal to the area of the second transducer 18 being the transducer other than the first transducer 17. In this configuration the propagation area of the bulk acoustic wave varies in the propagation direction of the bulk acoustic wave (i.e., the predetermined direction).

In the present embodiment, the thickness of the AlN films 12a being the first reflecting films is 0.6 μm, and the thickness of the $SiO_2$ films 12b being the second reflecting films 1.1 μm. The thickness of the piezoelectric film 13 of AlN is 2.25 μm, the thickness of the piezoelectric film 14 of the same material AlN 1.95 μm, the area of the first transducer 17 0.1 $mm^2$, the area of the propagation layer 19 and the second transducer 18 0.065 $mm^2$, and the thickness of the propagation layer 19 0.55 μm. Namely, in the piezoelectric resonator 10c the area of the propagation layer 19 and the area of the second transducer 18 are not more than 90% (65% in the present embodiment) of the area of the first transducer 17. In this configuration the propagation area of the bulk acoustic wave in the propagation layer 19 and the second transducer 18 is not more than 90% of the propagation area of the bulk acoustic wave in the first transducer 17. It is, however, a matter of course that the present invention is not limited to these numerical values.

The frequency characteristic of the piezoelectric resonator 10c shown in FIG. 7 is presented in FIG. 8.

In the piezoelectric resonator 10c of the present embodiment the area of the propagation layer 19 is smaller than that of the first transducer 17 and equal to that of the second transducer 18, whereby the propagation area of the bulk acoustic wave varies in the propagation direction of the bulk acoustic wave. Therefore, there occurs degeneration of modes in each of which a standing wave is excited. As a result, as indicated by a solid line in FIG. 8, the frequency difference between two peaks is small, approximately 230 MHz.

This makes it feasible to obtain a frequency property of an extremely broad band in which a band including this frequency difference is defined as a passing band, by effecting predetermined impedance matching with an external circuit or the like.

A dotted line in FIG. 8 indicates a frequency characteristic where inductance elements L are attached as a matching circuit. It is seen from the illustration that a passing characteristic of the broad band of about 490 MHz was obtained in a 2 dB bandwidth.

The above described the configurations for changing the propagation area of the bulk acoustic wave in the propagation direction of the bulk acoustic wave (the first to third embodiments), but it is noted that the present invention is by no means limited to these configurations. Namely, the necessary condition for the piezoelectric resonators of the present invention is that the area of at least one transducer or the propagation layer is different from that of the other transducers, and the increase or decrease of the area can be implemented in various patterns as long as the propagation area of the bulk acoustic wave varies in the propagation direction of the bulk acoustic wave.

The first to third embodiments are of the mode in which the present invention is applied to the SMR type piezoelectric resonators, but the present invention is applicable to all types of stacked piezoelectric resonators using the piezoelectric film, such as the diaphragm type piezoelectric resonators in which the substrate is cut in part to facilitate propagation of the bulk acoustic wave.

The diaphragm type piezoelectric resonators can also be constructed with or without the acoustic multilayer film as the SMR type piezoelectric resonators were. In the diaphragm type piezoelectric resonators without the acoustic multilayer film, however, the substrate is absent immediately below the lower electrode by being removed by etching or the like, in order to permit the vibrating part of the lower electrode to vibrate almost freely, different from the SMR type piezoelectric resonators.

Figure 10:
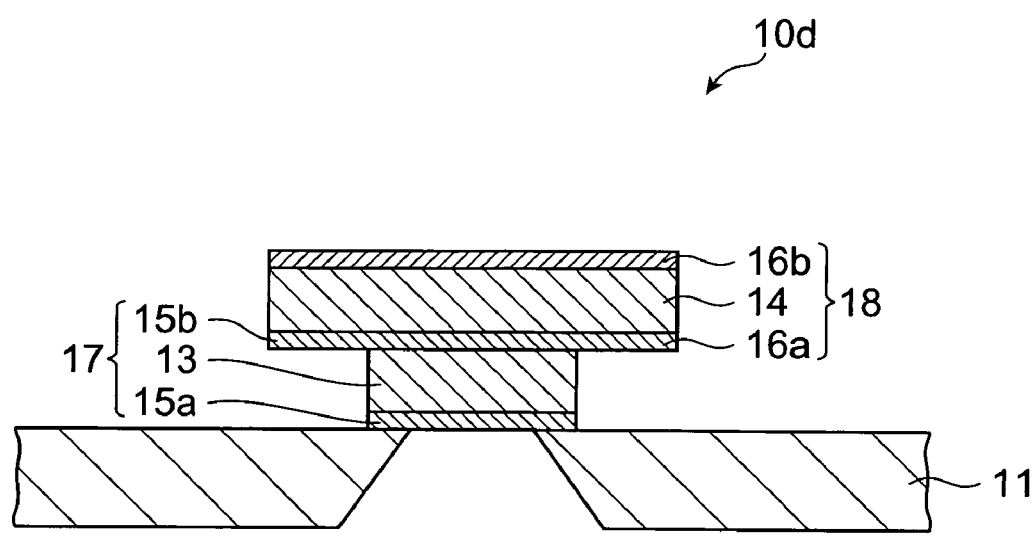
FIG. 10 is a sectional view showing a piezoelectric resonator according to another embodiment of the present invention.
Figure 11:
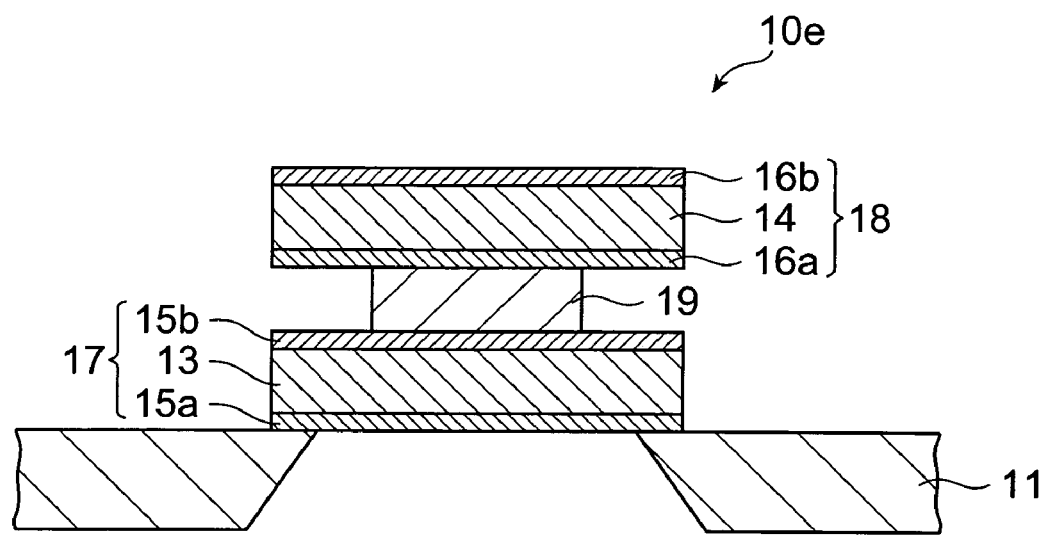
FIG. 11 is a sectional view showing a piezoelectric resonator according to still another embodiment of the present invention.
Figure 12:
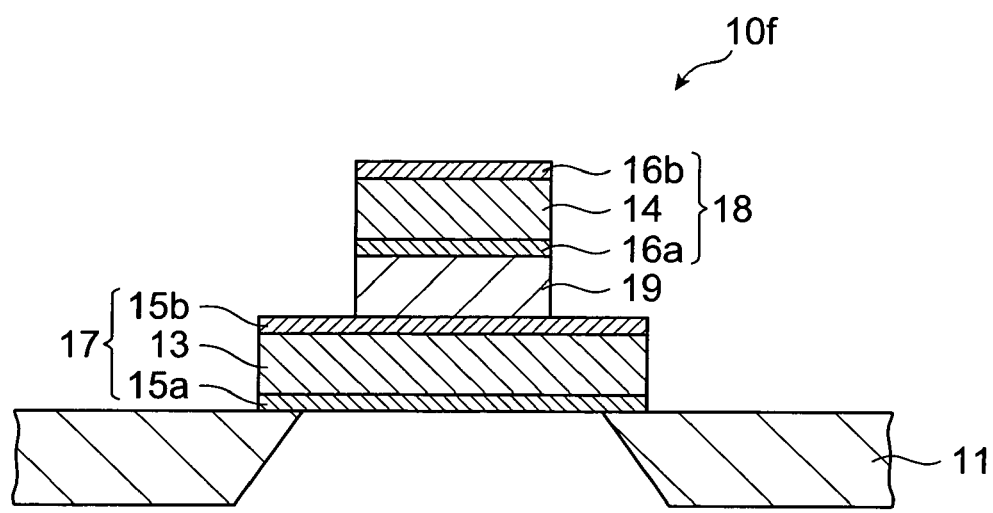
FIG. 12 is a sectional view showing a piezoelectric resonator according to still another embodiment of the present invention.

FIG. 10, FIG. 11, and FIG. 12 each are sectional views showing piezoelectric resonators according to other embodiments of the present invention. The piezoelectric resonators shown in FIGS. 10, 11, and 12 all are diaphragm type piezoelectric resonators.

The piezoelectric resonator 10d shown in FIG. 10 has a substrate 11, a first transducer 17, and a second transducer 18. The first transducer 17 is disposed on the substrate 11, and the second transducer 18 on the first transducer 17. The substrate 11 has a hole bored below the first transducer 17. The relation between the areas of the first transducer 17 and the second transducer 18 is the same as in the first embodiment.

Each of the piezoelectric resonator 10e shown in FIG. 11 and the piezoelectric resonator 10f shown in FIG. 12 has a substrate 11, a first transducer 17, a second transducer 18, and a propagation layer 19. In the both piezoelectric resonator 10e and piezoelectric resonator 10f, the first transducer 17 is disposed on the substrate 11, the propagation layer 19 is located between the first transducer 17 and the second transducer 18, and the substrate 11 has a hole bored below the first transducer 17. The relation among the areas of the first transducer 17, the second transducer 18, and the propagation layer 19 in the piezoelectric resonator 10e is the same as in the second embodiment, and the relation among the areas of the first transducer 17, the second transducer 18, and the propagation layer 19 in the piezoelectric resonator 10f is the same as in the third embodiment.

The present invention can be applied to electronic components such as filters or duplexers provided with the piezoelectric resonators described above.

As the embodiments of the present invention were described above, the present invention successfully provides the following effect. Namely, the present invention enables implementation of the piezoelectric resonator with the passing property of the broad band, because the propagation area of the bulk acoustic wave varies in the propagation direction of the bulk acoustic wave.

What is claimed is:

1. A piezoelectric resonator for obtaining a signal of a predetermined resonance frequency from a bulk acoustic wave propagating inside a piezoelectric film, the piezoelectric resonator comprising:

a plurality of transducers, each transducer having a first electrode film, a second electrode film, and the piezoelectric film disposed between the first electrode film and the second electrode film, wherein the plurality of transducers are stacked in a predetermined direction, and wherein a propagation area of the bulk acoustic wave varies in a propagation direction of the bulk acoustic wave; and a propagation layer disposed between two transducers out of the plurality of transducers, wherein an area of the propagation layer is different from an area of at least one transducer out of the plurality of transducers.

2. A piezoelectric resonator for obtaining a signal of a predetermined resonance frequency from a bulk acoustic wave propagating inside a piezoelectric film, the piezoelectric resonator comprising:

a plurality of transducers, each transducer having a first electrode film, a second electrode film, and the piezoelectric film disposed between the first electrode film and the second electrode film, wherein the plurality of transducers are stacked in a predetermined direction, and wherein a propagation area of the bulk acoustic wave varies in a propagation direction of the bulk acoustic wave; and a propagation layer disposed between two transducers out of the plurality of transducers, wherein an area of the propagation layer is different from an area of at least one transducer out of the plurality of transducers, and wherein the area of the propagation layer is smaller than the area of at least one transducer out of the plurality of transducers.

3. A piezoelectric resonator for obtaining a signal of a predetermined resonance frequency from a bulk acoustic wave propagating inside a piezoelectric film, the piezoelectric resonator comprising:

a plurality of transducers, each transducer having a first electrode film, a second electrode film, and the piezoelectric film disposed between the first electrode film and the second electrode film, wherein the plurality of transducers are stacked in a predetermined direction, and wherein a propagation area of the bulk acoustic wave varies in a propagation direction of the bulk acoustic wave;

a propagation layer disposed between two transducers out of the plurality of transducers, wherein an area of the propagation layer is different from an area of at least one transducer out of the plurality of transducers, and wherein the area of the propagation layer is smaller than the area of at least one transducer out of the plurality of transducers; and an acoustic multilayer reflecting film for reflecting the bulk acoustic wave, the acoustic multilayer reflecting film having a configuration wherein first reflecting films with a predetermined acoustic impedance and second reflecting films with an acoustic impedance different from that of the first reflecting films are alternately stacked in the predetermined direction, wherein the plurality of transducers are formed on the acoustic multilayer reflecting film, and wherein the area of the propagation layer is equal to an area of the transducers other than the transducer in contact with the acoustic multilayer reflecting film out of the plurality of transducers.

* * * * *